United States Patent [19]

Yanase et al.

[11] Patent Number: 4,486,858
[45] Date of Patent: Dec. 4, 1984

[54] MAGNETIC-BUBBLE MEMORY DEVICE

[75] Inventors: Takeyasu Yanase, Yokohama; Masashi Amatsu, Kawasaki, both of Japan

[73] Assignee: Fujitsu Limited, Kawasaki, Japan

[21] Appl. No.: 513,610

[22] Filed: Jul. 14, 1983

[30] Foreign Application Priority Data

Jul. 19, 1982 [JP] Japan ................. 57-125531

[51] Int. Cl.³ .............................. G11C 19/08
[52] U.S. Cl. .......................... 365/39; 365/13
[58] Field of Search .......... 365/15, 16, 13, 14, 365/39, 43

[56] References Cited

U.S. PATENT DOCUMENTS 4,355,373 10/1982 Bobeck .................. 365/15

Primary Examiner—James W. Moffitt
Attorney, Agent, or Firm—Staas & Halsey

[57] ABSTRACT

A magnetic-bubble memory device comprising a bubble propagation path defined by patterns of magnetically soft material, along which magnetic bubbles propagate in response to an in-plane rotating magnetic drive field. The bubble propagation path has a first track and a second track and a connection for interconnecting the first track and the second track. The first track is defined by conventional propagation patterns, and the second track is defined by known hook-shaped wide-gap patterns or modified wide-gap patterns. The connection includes a connection pattern having one end portion arranged with respect to the terminal pattern of the first track in the same constructional relationship as that between the successive patterns of the first track and another end portion arranged with respect to the terminal pattern of the second track in the same constructional relationship as that between the successive patterns of the second track. Such a bubble propagation track makes it possible to realize a 4 μm period 4 Mb bubble memory.

12 Claims, 28 Drawing Figures

PRIOR ART
Fig. 3
Fig. 4
Fig. 5
Fig. 6 PRIOR ART        Fig. 7 PRIOR ART
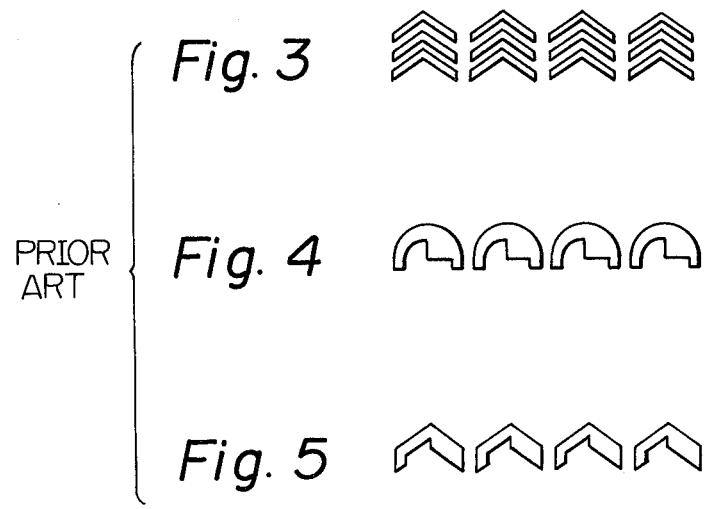
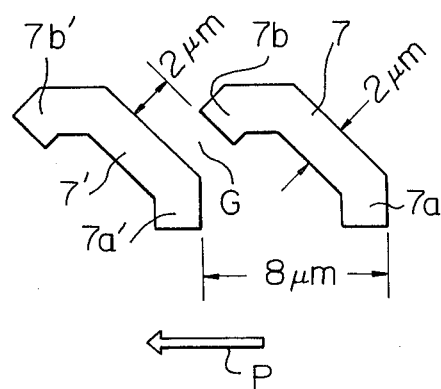
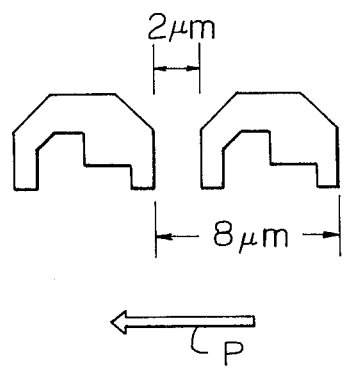

MAGNETIC-BUBBLE MEMORY DEVICE

This application is related to two applications having Ser. No. 505,978 filed June 20, 1983 and Ser. No. 513,657 filed July 14, 1983 which are assigned to the Assignee of the present application.

BACKGROUND OF THE INVENTION

1. Field of the Invention

The present invention relates to a magnetic-bubble memory device (hereinafter referred to as a bubble memory) and more particularly to a bubble propagation track defined by elements or patterns of magnetically soft material.

2. Description of the Prior Art

There are various types of bubble memories known in the prior art, the most common one being an in-plane field access type of bubble memory which comprises a thin layer of magnetic material in which magnetic bubbles can be propagated along propagation tracks in response to a magnetic drive field rotating or reorienting cyclically in the plane of the layer of magnetic material.

An in-plane field access type of bubble memory in which the bit period is 8 micrometers ($\mu$m) and the capacity is 1 megabit (Mb) has been realized, and a 4 $\mu$m period, 4 Mb bubble memory is now being developed.

There are two well-known types of propagation tracks, one being defined by elements or patterns of magnetically soft material such as permalloy and commonly called a "permalloy propagation track" and the other being defined by an ion-implanted pattern and commonly called an "ion-implanted propagation track". A 4 $\mu$m period ion-implanted track having superior propagation performance can be easily fabricated and is a very effective means for realizing a 4 $\mu$m period, 4 Mb bubble memory. However, superior-performance function gates for a 4 Mb bubble memory having a 4 $\mu$m period ion-implanted track, particularly, block-replicate gates for major-minor loop-organized bubble memories are still in the process of development.

Superior-performance function gates for a bubble memory having a permalloy track have already been realized. However, in realizing a 4 $\mu$m period permalloy track, there is a gap problem. There are known gap-tolerant permalloy propagation patterns, such as half-disk and asymmetric chevron patterns. However, an allowable gap for a gap-tolerant pattern is, at the most, one-eighth of the period. Therefore, in a 4 $\mu$m period permalloy track defined by gap-tolerant patterns, the gaps should have a width of 0.5 $\mu$m, which cannot be achieved by present-day photolithographic resolution.

New permalloy propagation patterns, called wide-gap patterns, have been reported by A. H. Bobeck, et al. (EA-1, 3M conference, Atlanta, 1981). In a wide-gap track defined by a wide-gap pattern (explained in detail with reference to the accompanying drawings), superior bubble propagation performance can be obtained with gaps of one-fourth of the period. Therefore, a wide-gap pattern is a very promising means for realizing a 4 $\mu$m period, 1 $\mu$m gap permalloy bubble propagation track which can be fabricated by present-day photolithography, thus realizing a 4 $\mu$m period, 4 Mb bubble memory.

However, in the realization of a 4 Mb bubble memory with a 4 $\mu$m period wide-open propagation track, there is a further problem. Conventional function gates in a bubble memory having a permalloy propagation track are defined by conventional patterns, such as half-disk or pickax patterns, and a conventional permalloy track has different magnetic characteristics than does a wide-gap permalloy track (described hereinafter). The bubble propagation performance when such different types of tracks are connected is poor.

SUMMARY OF THE INVENTION

It is an object of the present invention to provide a permalloy bubble propagation track in a magnetic-bubble memory device, comprising a conventional track defind by conventional propagation patterns and a wide-gap track as mentioned above, the two tracks being interconnected, and having superior propagation characteristics.

Another object of the present invention is to provide a 4 $\mu$m period, 4 Mb bubble memory having the permalloy bubble propagation track mentioned above.

According to the present invention, there is provided a magnetic bubble memory which comprises a magnetic layer in which magnetic bubbles can be moved and bubble propagation path along which the bubbles in the magnetic layer can be propagated in response to a magnetic drive field rotating in the plane of the magnetic layer. The propagation path include at least one path which has a first track and a second track and a connection for interconnecting the first track and the second track. The first track is defined by a plurality of propagation patterns of magnetically soft material arranged in the direction of bubble propagation so that the end portions of the successive patterns are adjacent to each other, with a gap therebetween. The second track is defined by a plurality of hook-shaped propagation patterns of magnetically soft material. The patterns have a first end portion and a second end portion and are arranged in the direction of bubble propagation so that the second end portion of a preceding pattern is not parallel to the first end portion of the succeeding pattern. The second end portion of the preceding pattern is separated from the first end portion of the succeeding pattern and is positioned opposite the outer edge of the succeeding pattern, with a gap therebetween. The connection includes a connection pattern of magnetically soft material. The first end portion of the connection pattern is arranged parallel to the adjacent one end portion of the terminal pattern of the first track and the top of the first end portion of the connection pattern aligns with the tip of the adjacent end portion of the terminal pattern of the first track in the bubble propagation direction. The second end portion of the connection pattern is arranged with respect to the terminal pattern of the second track in the same constructional relationship as that between the successive patterns of the second track.

The present invention will now be described in detail based on the preferred embodiments and in contrast with the prior art, with reference to the accompanying drawings.

BRIEF DESCRIPTION OF THE DRAWINGS

FIGS. 3, 4, and 5 illustrate various conventional permalloy bubble propagation tracks;

FIGS. 6 and 7 illustrate 8 μm period, 2 μm gap propagation tracks defined by known wide-gap patterns and conventional half-disk patterns, respectively;

DESCRIPTION OF THE PREFERRED EMBODIMENTS

Figure 1:
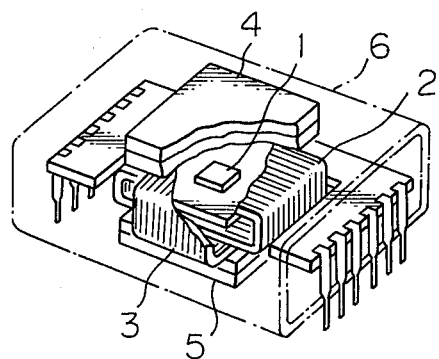
FIG. 1 is a partially broken perspective view of a conventional magnetic-bubble memory device illustrating the general construction thereof.

First, the prior art is described with reference to FIGS. 1 through 11. In FIG. 1, the bubble memory basically comprises a memory chip 1, two coils 2 and 3 disposed perpendicular to each other for generating an in-plane rotating magnetic field so as to drive magnetic bubbles in the chip, permanent magnets 4 and 5 for generating a bias magnetic field so as to stably maintain the bubbles/and a shield case 6 (illustrated by the phantom line).

Figure 2:
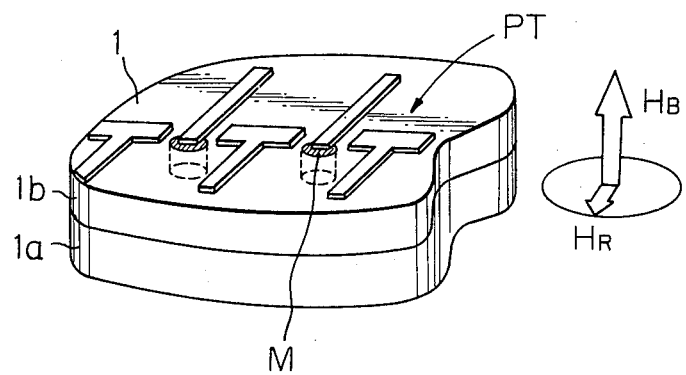
FIG. 2 is a diagrammatical perspective view of part of a conventional magnetic-bubble memory chip.
Figure 8:
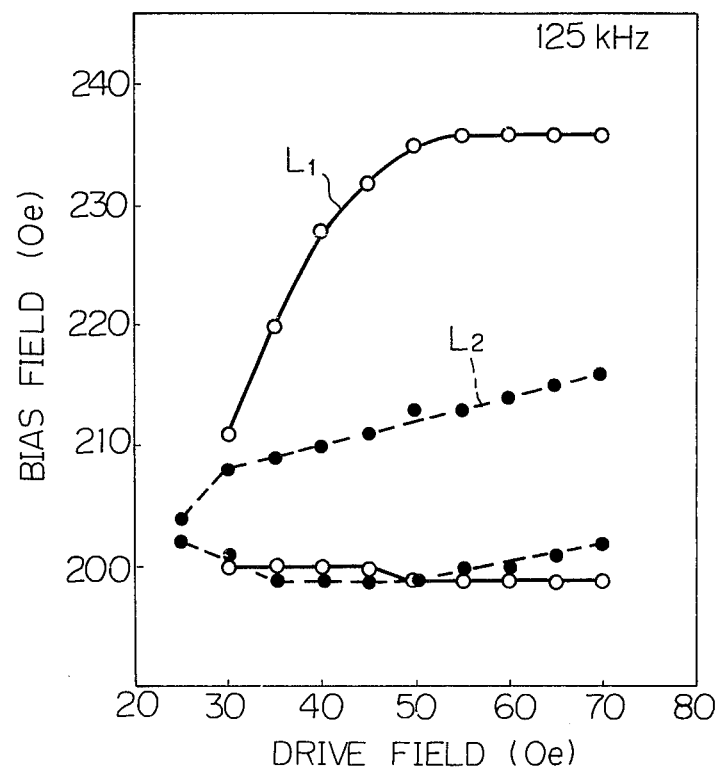
FIG. 8 is a graph showing the propagation characteristics of the tracks illustrated in FIGS. 6 and 7.

In FIG. 2, the memory chip 1 comprises a substrate 1a of, for example, gadolinium-gallium-garnet on which a thin layer 1b of magnetic material, such as magnetic garnet, is disposed. On the magnetic layer 1b, permalloy bubble propagation tracks PT, defined by bubble propagation patterns of magnetically soft material such as permalloy, are formed. The track PT illustrated in FIG. 2 is defined by well-known T- and bar-shaped patterns. FIGS. 3, 4, and 5 illustrate various other tracks defined by well-known chevron, half-disk, and asymmetric chevron patterns, respectively. The half-disk and asymmetric chevron patterns are gap-tolerant patterns. FIGS. 6 and 7 illustrate tracks which could be used with the connection pattern of the present invention.

FIG. 6 illustrates an 8 μm period, 2 μm gap wide-gap track defined by one of several kinds of wide-gap patterns reported to A. H. Bobeck et al. The wide-gap patterns, designated by reference numeral 7 and 7', have a hook-shaped or clubfoot-shaped pattern and a first end portion or leg 7a (7a') and a second end portion or arm 7b (7b'). The wide-gap track is defined by the hook-shaped patterns 7 and 7' which are arranged in the bubble propagation direction P in such a manner that the arm 7b of the preceding pattern 7 is not parallel to the leg 7a' of the succeeding pattern 7' and is positioned back from the leg 7a' with respect to the propagation direction P and opposite the outer edge of the succeeding pattern 7', with a gap G therebetween. FIG. 7 illustrates an 8 μm period, 2 μm gap track defined by conventional half-disk patterns. The adjacent end portions of the half-disk patterns are parallel to each other and the tips of the adjacent end portions are aligned with each other.

Figure 9:
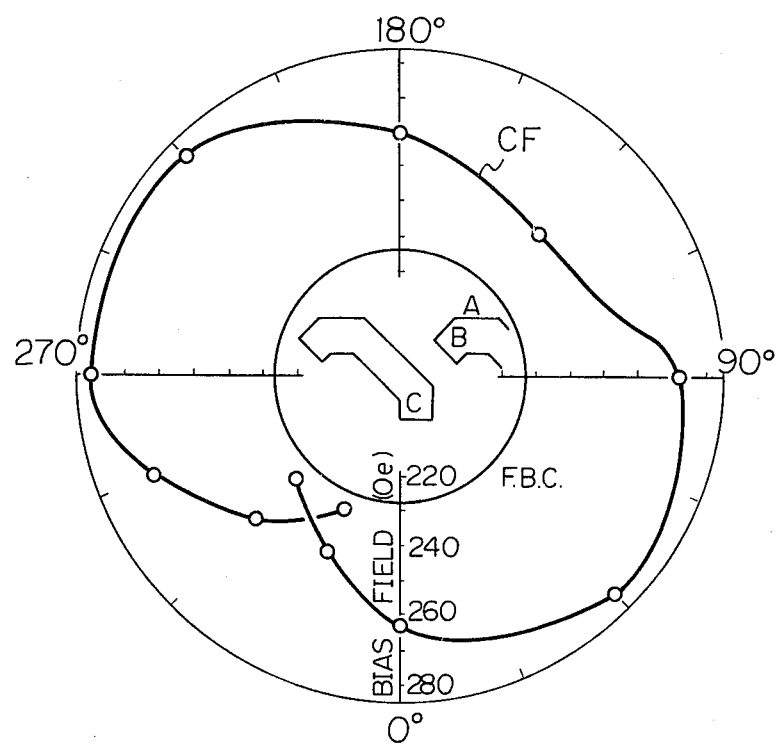
FIGS. 9 and 10 illustrate the magnetic characteristics of a wide-gap track.

The propagation characteristics of the wide-gap track and the half-disk track described above are as illustrated in FIG. 8 by the curves $L_1$ and $L_2$, respectively, under the conditions of a bubble diameter of 1.9 μm and a drive frequency of 125 kHz. From FIG. 8, it is clear that a large bias margin and a required low drive field are obtained in the wide-gap track while a poor bias margin is obtained in the half-disk track.

the large gap tolerance of the wide-gap track mentioned above is explained with reference to FIGS. 9, 10, and 11. FIG. 9 illustrates the magnetic potential well depths of the 8 μm period, 2 μm gap wide-gap track illustrated in FIG. 6, which depths are measured by observing the real bubble motion in a quasi-static operation. The curve CF shows bubble collapse fields at each phase of a 58 Oe rotating drive field. The collapse field at point B of the pattern, as is shown in the figure, gradually decreases as the drive field is rotated to 337.5° while the collapse field at point C of the next pattern has already become higher than the free-bubble collapse field (FBC) at 315° and gradually increases with further drive field rotation. After a phase of 337.5°, the collapse field at point C becomes much higher than that at point B, and the collapse field at point B assumes the same value as that of the free bubble, which means that point B becomes magnetically neutral. Consequently, a sufficient potential gradient to propagate a bubble across the gap can be supplied by repulsive magnetic poles at point A, a neutral pole at point B, and attractive poles at point C.

Figure 10:
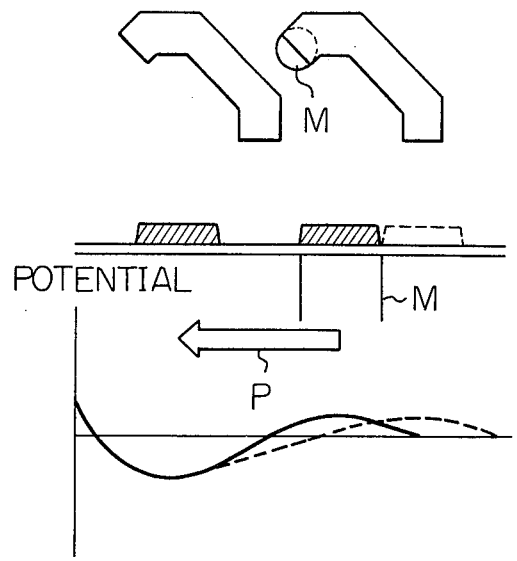
Figure 11:
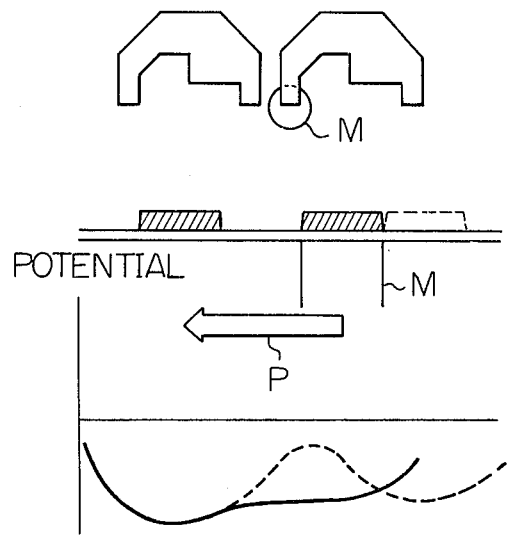
FIG. 11 illustrates the magnetic characteristics of a conventional permalloy track.

The superior gap tolerance of the wide-gap track is explained with reference to FIGS. 10 and 11, which illustrate the potential gradient across the pattern gap for the wide-gap track and the half-disk track, respectively. In the conventional half-disk track, deep and wide potential wells around the gap are deformed, presumably by a potential barrier created by the widening the gap, as is shown by the broken line in FIG. 11. This potential barrier would prevent most bubbles from stretching and propagating across the gap; only large-diameter bubbles, that is, bubbles of a low bias-field range, could get across it. However, in the wide-gap track, the above-mentioned magnetic pole formation is supposed to yield a smooth potential gradient when the gap is increased, as is shown in FIG. 10. Therefore, it is assumed that a design objective for a 4 μm period wide-gap track is to make the potential gradient between the elements as steep and smooth as possible by utilizing atrractive, neutral, and repulsive magnetic poles. By following this design rule, many variations in the 4 μm period wide-gap track have been constructed and tested.

Figure 12:
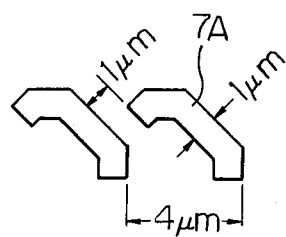
FIGS. 12, 13, and 14 illustrate various 4 μm period wide-gap tracks designed by the inventors of the present invention based on known wide-gap patterns.
Figure 13:
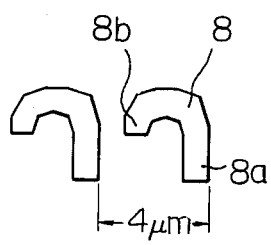
Figure 14:
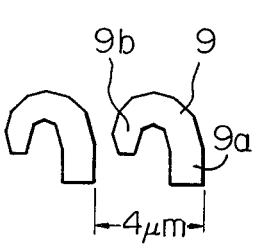
Figure 15:
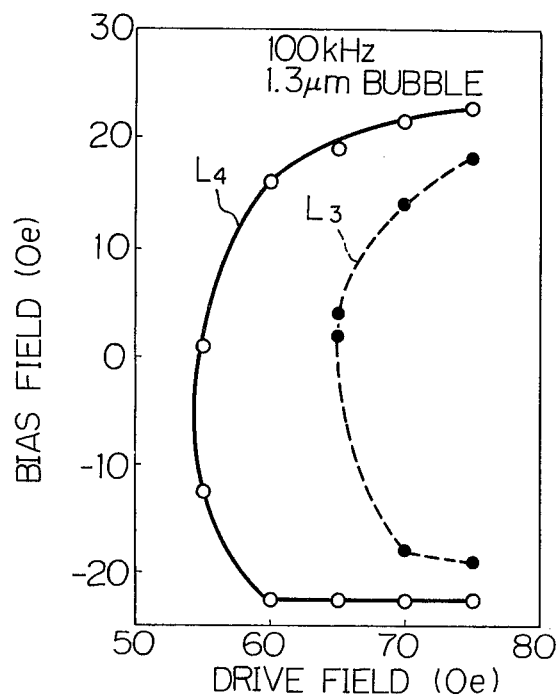
FIG. 15 is a graph showing the propagation characteristics of the tracks illustrated in FIGS. 13 and 14.

FIGS. 12-14 illustrate 4 μm period wide-gap tracks. FIG. 12 illustrates a 4 μm period wide-gap track scaled from the known 8 μm period wide-gap track shown in FIGS. 6. FIGS. 13 and 14 illustrate 4 μm period wide-gap tracks defined by modified wide-gap patterns designed by the inventors of the present invention. In the pattern 8 illustrated in FIG. 13, the leg 8a is longer and the arm 8b is slighty longer than the leg and arm of the pattern 7A illustrated in FIG. 12. In the pattern 9 illustrated in FIG. 14, the leg 9a is wider and the arm 9b is slightly longer than the leg and arm of the pattern 8 illustrated in FIG. 13. The propagation characteristics of the tracks illustraated in FIGS. 13 and 14 are illustrated in FIG. 15 by the curves $L_3$ and $L_4$, respectively, under the conditions of a bubble diameter of 1.3 μm and a drive frequency of 100 kHz. These characteristics are superior to those of the track illustrated in FIG. 12.

As mentioned above, one of the objects of the present invention is to provide a permalloy bubble propagation track with a portion defined by a conventional pattern and a portion defined by a wide-gap pattern like those described above and having superior bubble propagation characteristics so as to realize a 4 μm period, 4 Mb bubble memory.

FIGS. 16 through 21 illustrate various basic designs of the permalloy bubble propagation track according to the present invention. In these figures, the arrows X and Y designate the bubble propagation directions.

Figure 16:
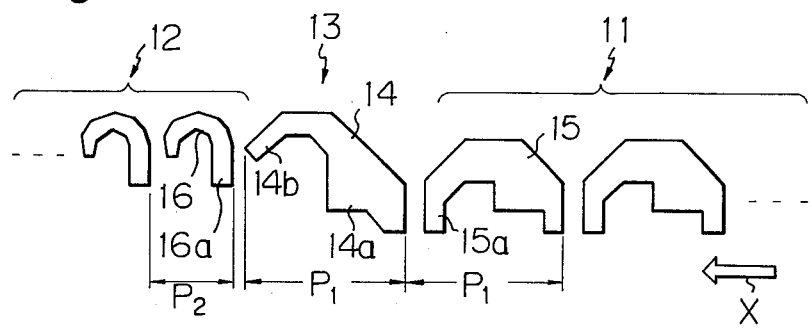
FIGS. 16, 17, 18, 19, 20, and 21 illustrate various basic designs of the permalloy bubble propagation track according to the present invention.
Figure 17:
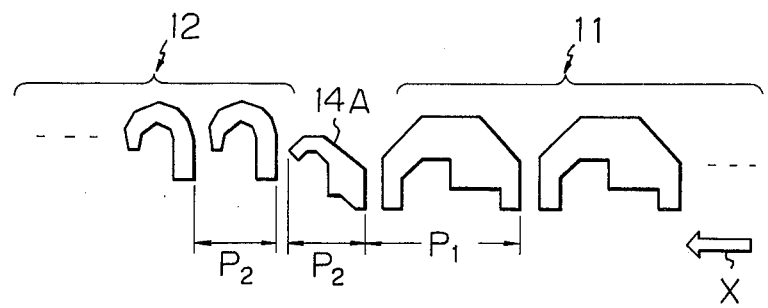

The track illustrated in FIG. 16 comprises a first track 11, a second track 12, and a connection 13 for interconnecting the tracks 11 and 12. The first track 11 is a conventional track defined by permalloy half-disk patterns and has a pattern period of $P_1$ (8 to 10 μm, for example). The second track 12 is a wide-gap track defined by such permalloy wide-gap patterns as illustrated in FIGS. 13 or 14 and has a pattern period of $P_2$ (4 μm, for example). The connection 13 includes a permalloy connection pattern 14. The connection pattern 14 is hook-shaped like the known wide-gap pattern, but the leg 14a is wider and the arm 14b is longer than those of the known wide-gap pattern.

The leg 14a of the connection pattern 14 and the end portion 15a of the terminal pattern 15 of the first track 11 are parallel to each other and the tips of the leg 14a and the end portion 15a are aligned with each other in the bubble propagation direction X. In other words, the constructional relationship between the patterns 14 and 15 are the same as the constructional relationship between the half-disk patterns in the first track 11 as described with reference to FIG. 11. Therefore the magnetic characteristics of the transfer of bubbles between patterns 14 and 15 and between the patterns in the first track 11 are the same.

The arm 14b of the connection pattern 14 is not parallel to the leg 16a of the end pattern 16 of the second track 12, is separated from the leg 16a and is positioned opposite the outer edge of the pattern 16. Therefore, the constructional relationship between the patterns 14 and 16 are the same as the constructional relationship between the wide-gap patterns of the second track 12 as described with reference to FIG. 10. Therefore, the magnetic characteristics of the transfer of bubbles between patterns 15 and 16 and the patterns in the second track 12 are the same. Consequently, superior propagation performance can be obtained by the connection 13.

It is desirable to make the length of the connection pattern as long as possible. The connection pattern 14 illustrated in FIG. 16 has the same length as the pattern period $P_1$ of the first track 11. However, the connection pattern length can be decreased to a length equal to the pattern period $P_2$ of the second track 12, like the connection pattern 12A illustrated in FIG. 17.

Figure 18:
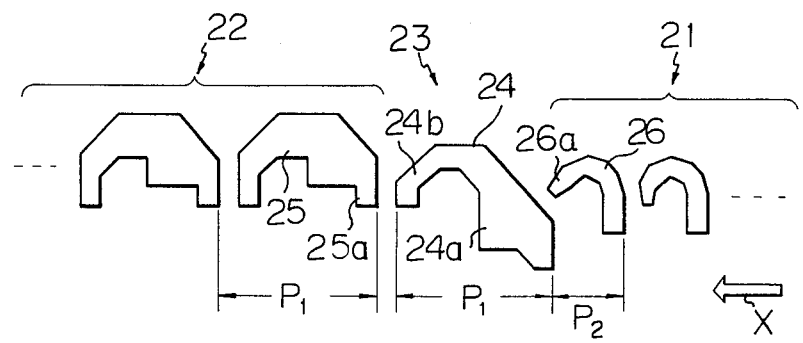

In FIG. 18, a connection 23 is preceded by a wide-gap track 21 and is followed by a half-disk track 22. The connection 23 includes a connection pattern 24, which is similar to the pattern 14 illustrated in FIG. 16 but has an arm 24b which is parallel to the end portion 25a of the terminal half-disk pattern 25 of the track 22 and is generally in the same constructional relationship with the half-disk pattern 25 as are the half-disk patterns of the track 22, described with reference to FIG. 11. Therefore, the magnetic characteristics of the transfer of bubbles between patterns 24 and 25 are the same as those for track 22. The arm 26a of the terminal pattern 26 of the track 21 is not parallel to the leg 24a of the connection pattern 24, is separated from the leg 24a and is positioned opposite the outer edge of the pattern 24. Therefore, the constructional relationship between and the magnetic characteristics of the patterns 26 and 24 are the same as the constructional relationship between and the magnetic characteristics of the wide-gap patterns of the first track 21, as described with reference to FIG. 10. Consequently, superior propagation performance can be obtained by the connection 23.

Figure 19:
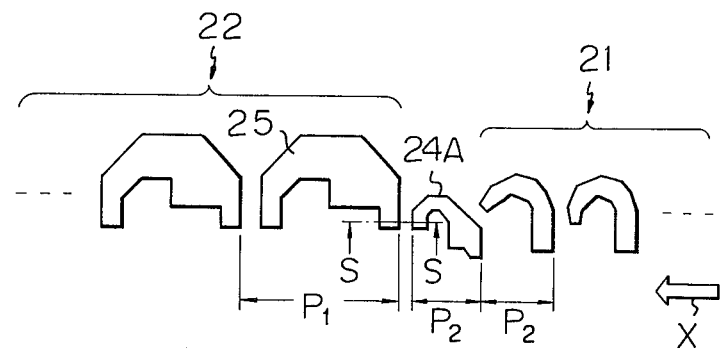
Figure 22:
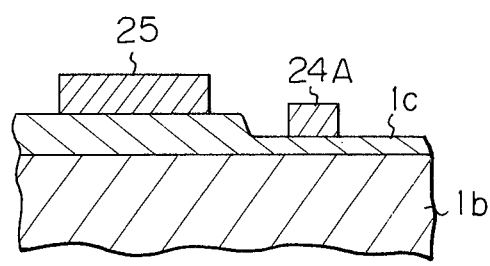
FIG. 22 is a sectional view of a bubble memory chip taken along the line S—S in FIG. 19.

It should be noted that the length of the connection pattern 24 is equal to the pattern period $P_1$ of the second track 22 but can be decreased to a length equal to the pattern period $P_2$ of the first track 21, like the connection pattern 24A illustrated in FIG. 19. However, in the embodiment illustrated in FIG. 19, the arm of the pattern 24A is much smaller than is the end portion of the pattern 25 and therefore the possiblity of the propagation performance deteriorating exists. This problem can be solved by constructing the bubble memory chip as illustrated in FIG. 22. In FIG. 22, reference numeral 1c designates a spacing layer formed on the magnetic layer 1b. The spacing layer 1c has a region on which the smaller pattern 24A is formed and which is thinner than the region on which the larger pattern 25 is formed. This construction of the spacing layer makes it possible to enhance the bubble-driving force created by the pattern 24A and to improve the propagation performance.

Figure 20:
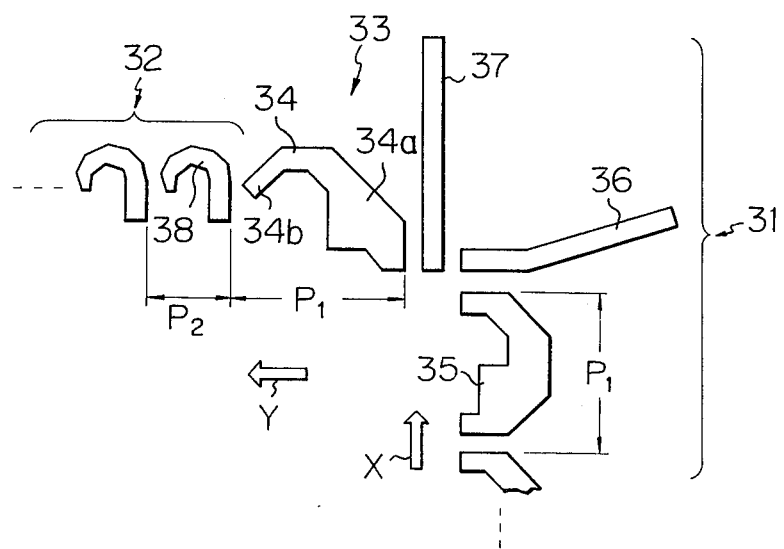

The track illustrated in FIG. 20 includes a conventional track 31 and a wide-gap track 32 perpendicular to each other and a connection 33. The conventional track 31 is defined by half-disk patterns 35 and bar patterns 36 and 37. The connection 33 includes a pattern 34, which is the same as the pattern 14 illustrated in FIG. 16. The leg 34a of the connection pattern 34 is arranged with respect to the bar pattern 37 so as to provide the same magnetic characteristics as those of a conventional track, and the arm 34b thereof is arranged with respect to a wide-gap pattern 38 so as to provide the same magnetic characteristics as those of a wide-gap track.

Figure 21:
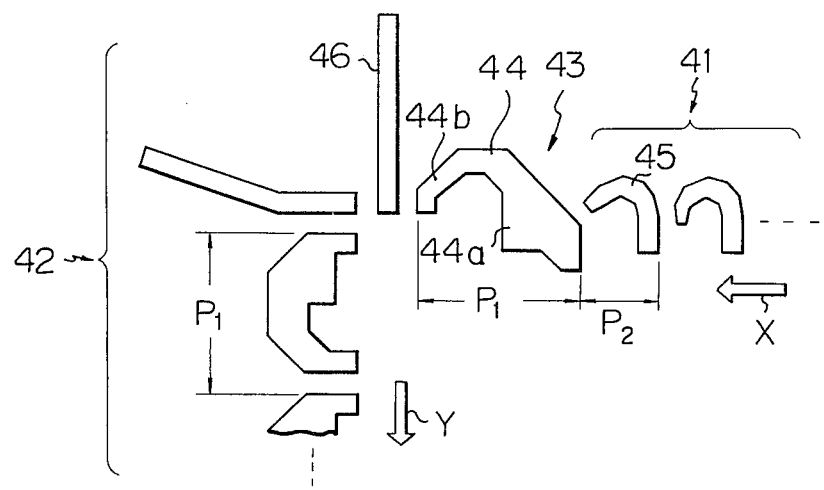

In the track illustrated in FIG. 21, the connection 43 includes a connection pattern 44, which is the same as the pattern 24 illustrated in FIG. 18. The connection pattern 44 is arranged to provide the same constructional relationship and magnetic characteristics as those of a wide-gap track with respect to the gap between the connection pattern 44 and the wide-gap pattern 45 of the first track 41. The connection pattern 44 also has the same constructional relationship and magnetic characteristics as those of a conventional track with respect to the gap between the connection pattern 44 and the bar pattern 46 of the second track 42.

Figure 23:
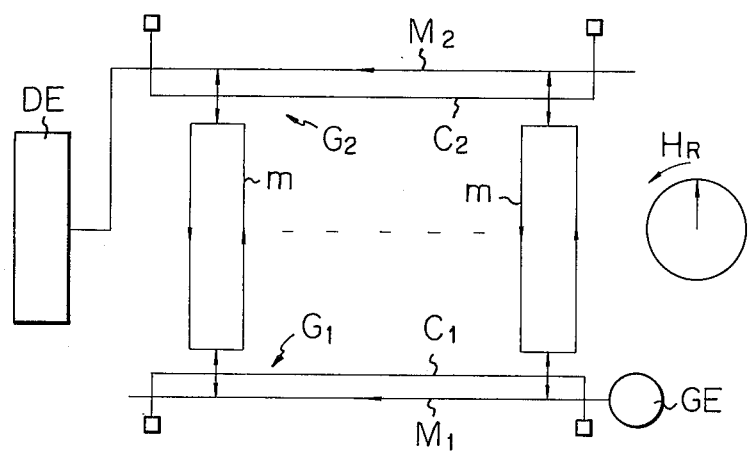
FIG. 23 illustrate the bubble circuit organization of a bubble memory according to the present invention.

As was mentiond above, the present invention provides a connection between a conventional permalloy track and a wide-gap permalloy track, which connection is superior in propagation characteristics, thereby making it possible to realize a 4 μm period, 4 Mb bubble memory. An embodiment of a 4 μm period, 4 Mb bubble memory according to the present invention is now described with reference to FIGS. 23 through 28. In FIG. 23, the bubble memory has a bubble circuit comprising a bubble generator GE, a bubble detector DE, a plurality of minor loops m for the storage of information, a major line $M_1$ for the writing in of information, a major line $M_2$ for the reading out information, swap gates $G_1$ for block swapping, and replicate gates $G_2$ for block replication. The symbols $C_1$ and $C_2$ designate conductors of the gates $G_1$ and $G_2$, respectively. Information bubbles are generated by the generator GE, are propagated along the major line $M_1$, and are written into the minor loops m by the swap gates $G_1$. The bubbles stored in the minor loops m are read out of the minor loops m into the major line $M_2$ by the replicate gates $G_2$ and are propagated along the major line $M_2$ to the detector DE, in which the information is read.

Figure 24:
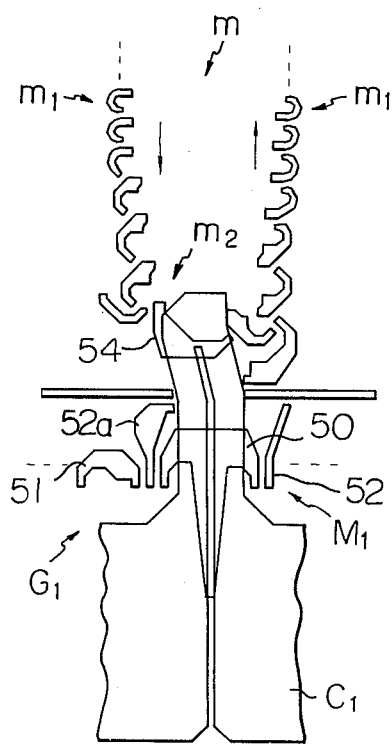
FIG. 24 illustrates a swap gate.
Figure 25:
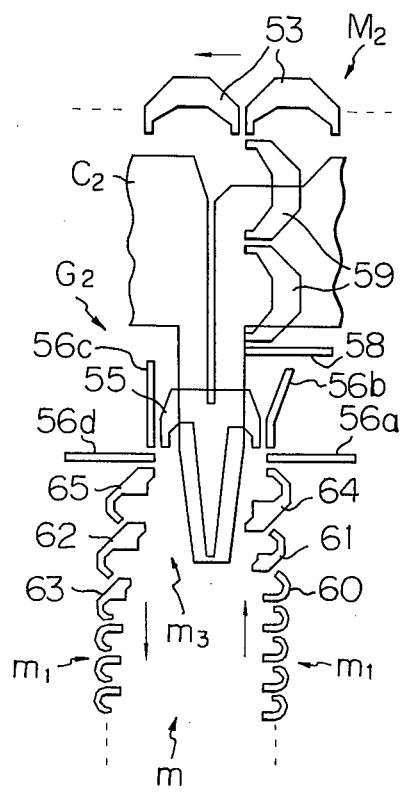
FIG. 25 illustrates a replicate gate.

FIGS. 24 and 25 illustrate one of the swap gates $G_1$ and one of the replicate gates $G_2$, respectively. Referring to FIG. 24, the major line $M_1$ is a conventional permalloy track defined by well-known pickax patterns 50, half-disk patterns 51, and bar patterns 52 and 52a. Referring to FIG. 25, the major line $M_2$ is also a conventional permalloy track defined by well-known half-disk patterns 53. Referring to FIGS. 24 and 25, the minor loop m has intermediate straight pieces $m_1$, an end piece $m_2$ associated with the gate $G_1$, and an end piece $m_3$ associated with the gate $G_2$. The intermediate pieces $m_1$ are defined by 4 $\mu$m period wide-gap patterns. The end piece $m_2$ is defined by wide-gap patterns including a gate transfer pattern 54 and having various pattern periods larger than 4 $\mu$m. The end piece $m_3$ is defined by a pickax pattern 55, bar patterns 56a, 56b, 56c, and 56d, wide-gap patterns 60, 61, 62, and 63 and connection patterns 64 and 65 having various periods larger than 4 $\mu$m. In FIG. 25, reference numerals 58 and 59 designate a bar pattern and half-disk patterns, respectively, which define an access track to the major line $M_2$.

The gate $G_1$ is defined by the gate transfer pattern 54 of the minor loop m, the pickax pattern 50 of the major line $M_1$ and the hairpin loop of the conductor $C_1$. The gate $G_2$ is defined by the pickax pattern 55 of the minor loop m, the patterns 58 and 59 of the access track and the hairpin loop of the conductor $C_2$. The operations of the swap gate $G_1$ and the replicate gate $G_2$ are well known and therefore are not described herein.

Figure 26:
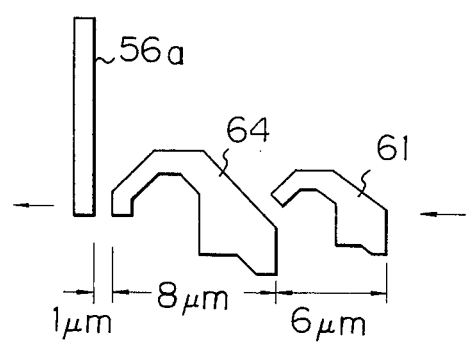
FIGS. 26 and 27 illustrate various connections between a bar pattern and a wide-gap pattern in a minor loop.
Figure 27:
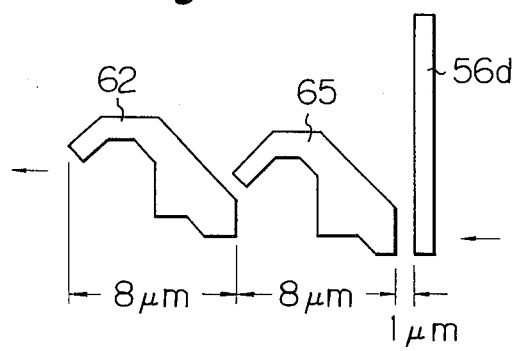
Figure 28:
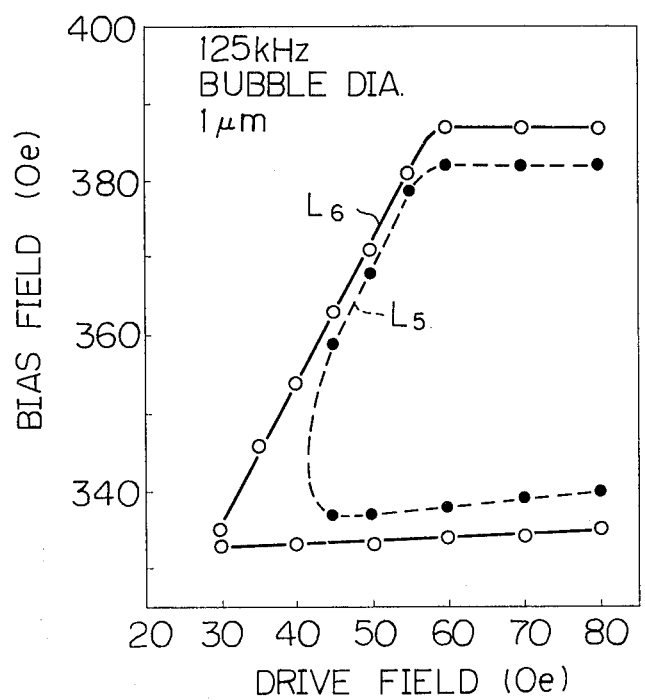
FIG. 28 is a graph showing the propagation characteristics of the connections illustrated in FIGS. 26 and 27.

Referring to FIG. 25, the bar patterns 56a and 56d of the minor loop end piece $m_3$ associated with the gate $G_2$ are connected to the wide-gap patterns 61 and 62, via the connection patterns 64 and 65, as is illustrated in detail in FIGS. 26 and 27, respectively. The connections illustrated in FIGS. 26 and 27 correspond to the connections 43 and 33 illustrated in FIGS. 21 and 20, respectively, and provide the propagation characteristics as shown in FIG. 28 by the curves $L_5$ and $L_6$, respectively. These propagation characteristics are superior to those of the 4 $\mu$m period wide-gap tracks shown in FIG. 15 and can be used in a practical magnetic-bubble memory device.

We claim:
1. A magnetic-bubble memory device in which magnetic bubbles are driven by a magnetic drive field, comprising:
   a magnetic layer in which the magnetic bubbles can be propagated; and
   a bubble propagation path along which the bubbles in said magnetic layer can be propagated in a bubble propagation direction in response to the magnetic drive field rotating in the plane of said magnetic layer, said bubble propagation path comprising:
   a first track comprising propagation patterns of magnetically soft material, including a first terminal pattern, each of the propagation patterns having end portions with tips, the propagation patterns arranged in the bubble propagation direction with the end portions of successive propagation patterns parallel to each other with a gap therebetween;
   a second track comprising hook-shaped propagation patterns of magnetically soft material, including a second terminal pattern, each of the hook-shaped propagation patterns having a first end portion and a second end portion, the hook-shaped propagation patterns arranged in the bubble propagation direction with the second end portion of a preceding pattern not parallel to and separated from the first end portion of the succeeding pattern; and
   a connection pattern of magnetically soft material, having a first end portion parallel to an adjacent end portion of the first terminal pattern, a first end portion tip aligned with the tip of the adjacent end portion of the first terminal pattern and with the bubble propagation direction, and a second end portion arranged with respect to the second terminal pattern in the same constructional relationship as the hook-shaped propagation patterns of said second track.

2. A magnetic-bubble memory device according to claim 1, wherein said connection pattern is preceded by the first track and followed by the second track with respect to the bubble propagation direction.

3. A magnetic-bubble memory device according to claim 1, wherein said connection pattern is followed by the first track and preceded by the second track with respect to the bubble propagation direction.

4. A magnetic-bubble memory device according to claim 1, wherein said connection pattern has a length in the bubble propagation direction which is approximately the same as a pattern period of said first track.

5. A magnetic-bubble memory device according to claim 1, wherein said connection pattern has a length in the bubble propagation direction which is less than the pattern period if said first track.

6. A magnetic-bubble memory device according to claim 1, wherein said second track precedes said first track and the second end portion of said connection pattern is wider and longer than the first end portion of said connection pattern and has a tip with two levels.

7. A magnetic-bubble memory device according to claim 6, wherein said connection pattern has a first pattern period, said second track has a second pattern period smaller than the first pattern period and the second terminal pattern has a second end portion shaped like the second end portion of each of the hook-shaped propagation patterns and a first end portion wider than the first end portion of each of the hook-shaped propagation patterns, where the second terminal pattern has a third pattern period smaller than the first pattern period and larger than the second pattern period.

8. A magnetic-bubble memory device according to claim 7, wherein the propagation patterns of said first track have a bar shape with a center line which runs perpendicular to the bubble propagation direction.

9. A magnetic-bubble memory device according to claim 6, wherein said first track has a first pattern period, said second track and said connection pattern have a second pattern period smaller than the first pattern period and said second track and said connection pattern are closer to the magnetic layer than said first track.

10. A magnetic-bubble memory device in which magnetic bubbles are driven by a magnetic drive field, comprising:

a magnetic layer in which the magnetic bubbles can be propagated in response to the magnetic drive field; and a double propagation path along which the bubbles in said magnetic layer can be propagated, comprising:

a first track in a first bubble propagation direction comprising:

first hook-shaped patterns of magnetically soft material, having a first end portion and a second end portion, said first hook-shaped patterns arranged in the first bubble propagation direction with the second end portion of one of the first hook-shaped patterns separated from the first end portion of an adjacent first hook-shaped pattern in the first bubble propagation direction and in a direction generally perpendicular to the first bubble propagation direction;

a modified hook-shaped pattern, following said first hook-shaped patterns in the first bubble propagation direction, having a first end portion aligned with the first end portion of each of the first hook-shaped patterns and a second end portion; and a first terminal pattern, following said modified hook-shaped pattern in the bubble propagation direction, having a first end portion wider than the first end portion of the first hook-shaped patterns, an outer edge substantially perpendicular to and separated from the second end portion of said modified hook-shaped pattern and a second end portion;

a first connection pattern having a first end portion wider than the first end portion of said first terminal pattern, an outer edge substantially perpendicular to and separated from the second end portion of said first terminal pattern and a second end portion with a tip; and a gate for receiving magnetic bubbles from said first connection pattern;

a second connection pattern having a first end portion for receiving magnetic bubbles from said gate and a second end portion; and a second track, arranged in a second bubble propagation direction, comprising:

a second terminal pattern having a first end portion as wide as the first end portion of said first terminal pattern, an outer edge disposed adjacent and substantially perpendicular to and separated from the second end portion of said second connection pattern, and a second end portion; and second hook-shaped patterns of magnetically soft material, having a first end portion and a second end portion, said second hook-shaped patterns arranged in the second bubble propagation direction with the second end portion of one of the second hook-shaped pattern separated from the first end portion of an adjacent second hook-shaped pattern in the second bubble propagation direction and in a direction perpendicular to the second bubble propagation direction.

11. A magnetic-bubble memory device according to claim 10, wherein said gate is a replicate gate, comprising:

a first bar pattern having a tip separated from and aligned in the first bubble propagation direction with the tip of the second end portion of said first connection pattern;

a crooked-bar pattern, having an end portion with a tip, the end portion of said crooked-bar pattern substantially perpendicular to and separated from said first bar pattern and the tip of the end portion of said crooked-bar pattern aligned with the tip of said first bar pattern in the first bubble propagation direction;

a pickax pattern, on a first level, aligned for propagation of magnetic bubbles from said crooked-bar pattern to said pickax pattern;

a U-shaped conductor, on a second level different from said first level, for replicating magnetic bubbles propagating along said pickax pattern; and a second-bar pattern having an end portion aligned with said pickax pattern for propagation of magnetic bubbles from said pickax pattern to said second-bar pattern;

a third-bar pattern, perpendicular to said second bar pattern having an end portion aligned with the end portion of said second-bar pattern in the second bubble propagation direction opposite to the first bubble propagation direction; and a third track, comprising propagation patterns of magnetically soft-material, for accepting magnetic bubbles replicated by said U-shaped conductor, and wherein the first end portion of said second connection pattern is separated from and aligned with the end portion of said third bar pattern.

12. A magnetic-bubble memory device according to claim 10, wherein said gate is a swap gate, comprising:

a crooked-bar pattern, having a first end portion substantially parallel to the second end portion of said first connection pattern, a mid-section and a second end portion with a tip, the second end portion of said crooked-bar pattern being substantially perpendicular to and separated from the second end portion of said first connection pattern and the tip of the second end portion of said crooked-bar pattern aligned with the tip of the second end portion of said first connection pattern;

a gate transfer pattern, on a first level, having a first end portion adjacent to and separated from the tip of the second end portion of said crooked-bar shaped pattern, a mid-section substantially perpendicular to the first and second bubble propagation directions and a second end portion;

a U-shaped conductor, on a second level different from said first level, for swapping magnetic bubbles with said gate transfer pattern;

a first modified half-disk pattern having an outer edge substantially perpendicular to and separated from the second end portion of said gate transfer pattern and an end portion; and a second modified half-disk pattern having an inner edge substantially parallel to the end portion of said first modified half-disk pattern and an end portion substantially perpendicular to the end portion of said first modified half-disk pattern, and wherein the first end portion of said second connection pattern includes an outer edge substantially perpendicular to and separated from the end portion of said second modified half-disk pattern.

* * * * *

UNITED STATES PATENT AND TRADEMARK OFFICE
CERTIFICATE OF CORRECTION

PATENT NO. : 4,486,858
DATED : December 4, 1984
INVENTOR(S) : Yanase et al.

It is certified that error appears in the above-identified patent and that said Letters Patent is hereby corrected as shown below:

```
Column 2, line 13, "defind" should be --defined--.
Column 3, line 20, "illustrate" should be --illustrates--;
          line 40, "bubbles/and" should be --bubbles and--.
Column 4, line 15, "the" should be --The--;
          line 43, delete "the";
          line 55, "atrractive" should be --attractive--;
          line 62, "Figs" (first occurrence) should be
--Fig--.
Column 5, line 3, "illustraated" should be --illustrated--.
Column 6, line 9, "positined" should be --positioned--.
Column 9, line 11, "double" should be --bubble--.
Column 10,line 28, "soft-material" should be --soft material--.
```

Signed and Sealed this

Twenty-fifth Day of June 1985

[SEAL]

Attest:

DONALD J. QUIGG

Attesting Officer    Acting Commissioner of Patents and Trademarks